United States Patent
Ko

(10) Patent No.: US 7,197,672 B2
(45) Date of Patent: *Mar. 27, 2007

(54) RECORDING MEDIUM HAVING SPARE AREA FOR DEFECT MANAGEMENT AND INFORMATION ON DEFECT MANAGEMENT, AND METHOD OF ALLOCATING SPARE AREA AND METHOD OF MANAGING DEFECTS

(75) Inventor: Jung-wan Ko, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/844,489

(22) Filed: May 13, 2004

(65) Prior Publication Data

US 2004/0243911 A1    Dec. 2, 2004

Related U.S. Application Data

(60) Continuation of application No. 10/421,753, filed on Apr. 24, 2003, now Pat. No. 6,868,511, which is a division of application No. 09/986,307, filed on Nov. 8, 2001, now Pat. No. 6,578,163, which is a division of application No. 09/635,667, filed on Aug. 10, 2000, now Pat. No. 6,408,408, which is a division of application No. 09/437,451, filed on Nov. 10, 1999, now Pat. No. 6,367,038.

(30) Foreign Application Priority Data

Nov. 10, 1998   (KR) .................................. 98-48008
Feb. 10, 1999   (KR) .................................. 1999-4678

(51) Int. Cl.
   *G11C 29/00*   (2006.01)
(52) U.S. Cl. ...................................... 714/710; 714/723
(58) Field of Classification Search ................ 714/710, 714/723
    See application file for complete search history.

(56) References Cited

U.S. PATENT DOCUMENTS 5,111,444 A    5/1992    Fukushima et al.

(Continued)

FOREIGN PATENT DOCUMENTS

EP    0350920    1/1990

(Continued)

OTHER PUBLICATIONS

ECMA: Standardizing Information and Communication Systems: "Standard ECMA-272: 120 mm DVD Rewritable Disk (DVD-RAM), First Edition", Standard ECMA, XX, XX, No. 272, Feb. 1998, pp. 43-51, XP002114221.

(Continued)

*Primary Examiner*—Joseph D. Torres
(74) *Attorney, Agent, or Firm*—Stein, McEwen & Bui, LLP

(57) ABSTRACT

A recording medium includes a spare area and the management information of the spare area. When a primary spare area is allocated for slipping replacement and linear replacement upon initialization, and a remaining portion of the primary spare area after slipping replacement and allocated for linear replacement after initialization are insufficient, allocating a supplementary spare area. The sizes of the primary and supplementary spare areas are determined by the number of defects generated upon initialization. The information on the sizes of the spare areas, and the remainder state information are recorded to efficiently manage the spare areas. In performing defect management, when an area that has already been linearly replaced is allocated as a supplementary spare area, defective blocks within the allocated supplementary spare area are not used for linear replacement, and the entries of a secondary defect list (SDL) with respect to the defective blocks are not changed.

13 Claims, 8 Drawing Sheets

U.S. PATENT DOCUMENTS

| | | | |
|---|---|---|---|
| 5,235,585 A | 8/1993 | Bish et al. | |
| 5,237,553 A | 8/1993 | Fukushima et al. | |
| 5,271,018 A * | 12/1993 | Chan | 714/710 |
| 5,303,219 A | 4/1994 | Kulakowski et al. | |
| 5,418,767 A | 5/1995 | Gaudet et al. | |
| 5,548,572 A | 8/1996 | Kulakowski et al. | |
| 5,715,221 A | 2/1998 | Ito et al. | |
| 5,805,547 A | 9/1998 | Yamamuro | |
| 5,914,928 A | 6/1999 | Takahashi | |
| 6,049,515 A | 4/2000 | Yamamuro | |
| 6,101,162 A * | 8/2000 | Kim | 711/100 |
| 6,134,214 A | 10/2000 | Takagi et al. | |
| 6,160,778 A | 12/2000 | Ito et al. | |
| 6,189,118 B1 | 2/2001 | Sasaki et al. | |
| 6,367,038 B1 | 4/2002 | Ko | |
| 6,408,408 B1 | 6/2002 | Ko | |
| 6,578,163 B2 * | 6/2003 | Ko | 714/710 |
| 6,708,300 B2 * | 3/2004 | Ko | 714/723 |

FOREIGN PATENT DOCUMENTS

| | | |
|---|---|---|
| EP | 0997905 | 5/2000 |
| EP | 1118993 | 7/2001 |
| JP | 5-054547 | 3/1993 |
| JP | 6-5002 | 1/1994 |
| JP | 06-338139 | 12/1994 |
| JP | 6-338139 | 12/1994 |
| JP | 7-182792 | 7/1995 |
| JP | 9-35423 | 2/1997 |
| JP | 09-251721 | 9/1997 |
| JP | 10-021552 | 1/1998 |
| JP | 10-125008 | 5/1998 |
| WO | WO97/35309 | 9/1997 |

OTHER PUBLICATIONS

IBM Technical Disclosure Bulletin NA920935, "Method for Translating Logical Block Addresses to Physical Addresses on Magneto-optic Media", Sep. 1, 1992, vol. 35, Issue No. 4A, pp. 35-40.

U.S. Appl. No. 10/699,657, filed Nov. 4, 2003, Jung-wan Ko, Samsung Electronics Co., Ltd.

U.S. Appl. No. 10/699,697, filed Nov. 4, 2003, Jung-wan Ko, Samsung Electronics Co., Ltd.

Japanese Office Action for Japanese Patent Divisional Application No. 2002-217209, dated May 11, 2004 (related to the present application).

Office Action issued in Korean Patent Application No. 1999-4678 on Nov. 14, 2005.

* cited by examiner

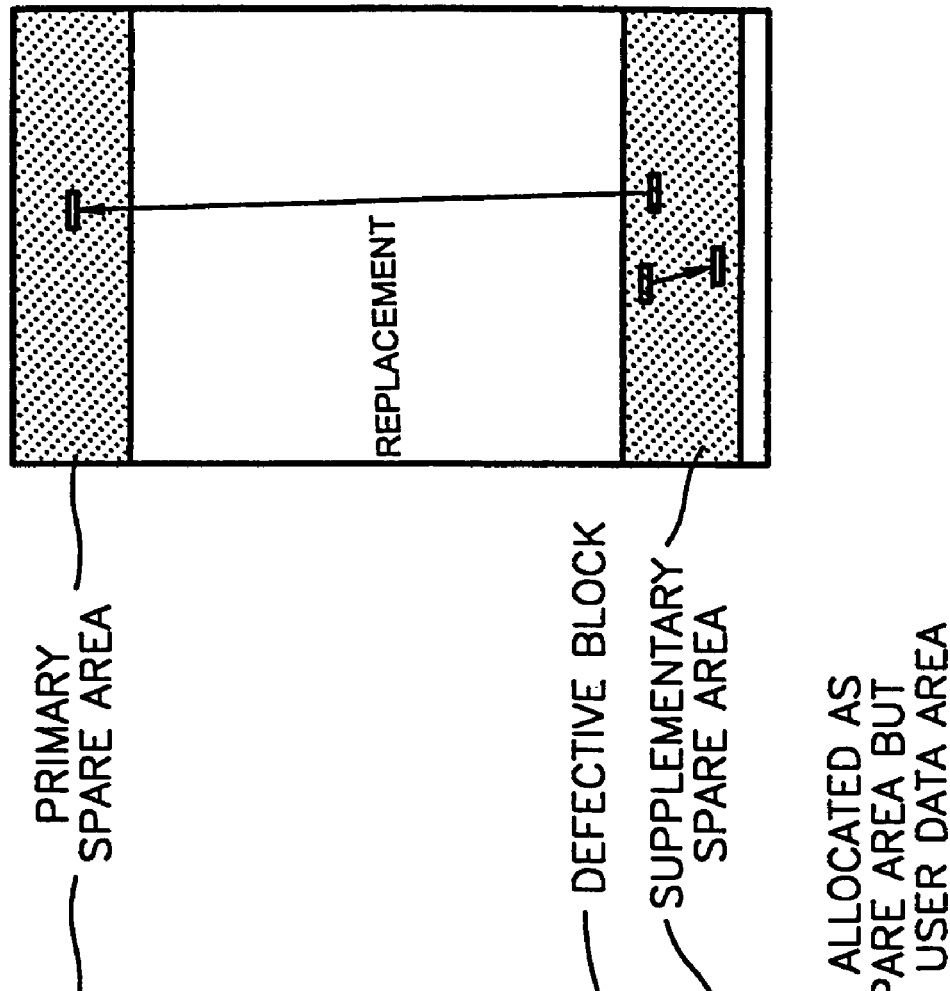

FIG. 4A

32K BUFFER MEMORY MODEL

| Number of PDL Entries | Max. no. of SDL Entries | Min. Alloc. | Min. Required Spare area(32K) | | | Total no. of defects | Recommended spare area | | | |
|---|---|---|---|---|---|---|---|---|---|---|
| | | | Blocks | MB | % | | +32BLK | | +48BLK | |
| 0 – 511 | 3837 | 320 | 3901 | 127.8 | 2.7 | 4348 | 4096 | 2.8 | 4096 | 2.8 |
| 512 – 1023 | 3581 | 352 | 3677 | 120.5 | 2.5 | 4604 | 3872 | 2.7 | 3888 | 2.7 |
| 1024 – 1535 | 3325 | 384 | 3453 | 113.1 | 2.4 | 4860 | 3648 | 2.5 | 3680 | 2.5 |
| 1536 – 2047 | 3069 | 416 | 3229 | 105.8 | 2.2 | 5116 | 3424 | 2.4 | 3472 | 2.4 |
| 2048 – 2559 | 2813 | 448 | 3005 | 98.5 | 2.1 | 5372 | 3200 | 2.2 | 3264 | 2.3 |
| 2560 – 3071 | 2557 | 480 | 2781 | 91.1 | 1.9 | 5628 | 2976 | 2.1 | 3056 | 2.1 |
| 3072 – 3583 | 2301 | 512 | 2557 | 83.8 | 1.8 | 5884 | 2752 | 1.9 | 2848 | 2.0 |
| 3584 – 4095 | 2045 | 544 | 2333 | 76.4 | 1.6 | 6140 | 2528 | 1.7 | 2640 | 1.8 |
| 4096 – 4607 | 1789 | 576 | 2109 | 69.1 | 1.5 | 6396 | 2304 | 1.6 | 2432 | 1.7 |
| 4608 – 5119 | 1533 | 608 | 1885 | 61.8 | 1.3 | 6652 | 2080 | 1.4 | 2224 | 1.5 |
| 5120 – 5631 | 1277 | 640 | 1661 | 54.4 | 1.1 | 6908 | 1856 | 1.3 | 2016 | 1.4 |
| 5632 – 6143 | 1021 | 672 | 1437 | 47.1 | 1.0 | 7164 | 1632 | 1.1 | 1808 | 1.3 |
| 6144 – 6655 | 765 | 704 | 1213 | 39.7 | 0.8 | 7420 | 1408 | 1.0 | 1600 | 1.1 |
| 6656 – 7167 | 509 | 736 | 989 | 32.4 | 0.7 | 7676 | 1184 | 0.8 | 1392 | 1.0 |
| 7168 – 7679 | 253 | 768 | 765 | 25.1 | 0.5 | 7932 | 960 | 0.7 | 1184 | 0.8 |

FIG. 4B

64K BUFFER MEMORY MODEL

| Number of PDL Entries | Max. no. of SDL Entries | Min. Alloc. | Min. Required Spare area(64K) | | | Total no. of defects | Recommended spare area | | | |
|---|---|---|---|---|---|---|---|---|---|---|
| | | | Blocks | MB | % | | +32BLK | | +48BLK | |
| 0 – 511 | 3837 | 320 | 3901 | 127.8 | 2.7 | 4348 | 4096 | 2.8 | 4096 | 2.8 |
| 512 – 1023 | 3837 | 352 | 3933 | 128.9 | 2.7 | 4860 | 4128 | 2.9 | 3888 | 2.9 |
| 1024 – 1535 | 3837 | 384 | 3965 | 129.9 | 2.7 | 5372 | 4160 | 2.9 | 3680 | 2.9 |
| 1536 – 2047 | 3837 | 416 | 3997 | 131.0 | 2.8 | 5884 | 4192 | 2.9 | 3472 | 2.9 |
| 2048 – 2559 | 3837 | 448 | 4029 | 132.0 | 2.8 | 6396 | 4224 | 2.9 | 3264 | 3.0 |
| 2560 – 3071 | 3837 | 480 | 4061 | 133.1 | 2.8 | 6908 | 4256 | 2.9 | 3056 | 3.0 |
| 3072 – 3583 | 3837 | 512 | 4093 | 134.1 | 2.8 | 7420 | 4288 | 3.0 | 2848 | 3.0 |
| 3584 – 4095 | 3837 | 544 | 4125 | 135.2 | 2.9 | 7932 | 4320 | 3.0 | 2640 | 3.1 |
| 4096 – 4607 | 3837 | 576 | 4157 | 136.2 | 2.9 | 8444 | 4352 | 3.0 | 2432 | 3.1 |
| 4608 – 5119 | 3837 | 608 | 4189 | 137.3 | 2.9 | 8956 | 4384 | 3.0 | 2224 | 3.1 |
| 5120 – 5631 | 3837 | 640 | 4221 | 138.3 | 2.9 | 9468 | 4416 | 3.1 | 2016 | 3.2 |
| 5632 – 6143 | 3837 | 672 | 4253 | 139.4 | 2.9 | 9980 | 4448 | 3.1 | 1808 | 3.2 |
| 6144 – 6655 | 3837 | 704 | 4285 | 140.4 | 3.0 | 10492 | 4480 | 3.1 | 1600 | 3.2 |
| 6656 – 7167 | 3837 | 736 | 4317 | 141.5 | 3.0 | 11004 | 4512 | 3.1 | 1392 | 3.3 |
| 7168 – 7679 | 3837 | 768 | 4349 | 142.5 | 3.0 | 11516 | 4544 | 3.1 | 1184 | 3.3 |

RECORDING MEDIUM HAVING SPARE AREA FOR DEFECT MANAGEMENT AND INFORMATION ON DEFECT MANAGEMENT, AND METHOD OF ALLOCATING SPARE AREA AND METHOD OF MANAGING DEFECTS

CROSS-REFERENCE TO RELATED APPLICATIONS

This application is a Continuation of application Ser. No. 10/421,753 filed on Apr. 24, 2003, now U.S. Pat. No. 6,868,511, which is a divisional of application Ser. No. 09/986,307 filed on Nov. 8, 2001, now issued as U.S. Pat. No. 6,578,163, which is a divisional of application Ser. No. 09/635,667 filed on Aug. 10, 2000, now issued as U.S. Pat. No. 6,408,408, which is a divisional of parent application Ser. No. 09/437,451 filed on Nov. 10, 1999, now issued as U.S. Pat. No. 6,367,038, and claims the benefit of Korean Application No. 98-48008, filed Nov. 10, 1998 and Korean Application No. 99-4678, filed Feb. 10, 1999, in the Korean Patent Office, the disclosures of which are incorporated herein by reference.

BACKGROUND OF THE INVENTION

1. Field of the Invention

The present invention relates to the field of optical recording media, and more particularly, to a disc having information on the sizes of allocated spare areas and the remaining amounts thereof, in which an appropriate amount of a primary spare area is allocated upon initialization, and a supplementary spare area is allocated if the primary spare area is insufficient while being used after completion of initialization, a method of allocating the spare areas, and a method of managing the defects of the primary and supplementary spare areas.

2. Description of the Related Art

In recording media such as general discs, a spare area is allocated once upon initialization and no supplementary spare area is allocated during use of the disc. However, in order to increase the efficiency of using a disc, an appropriate amount of spare area is allocated according to the state of the disc upon initialization, and a supplementary spare area is allocated when the spare area allocated upon initialization is insufficient while the disc is being used.

According to a digital versatile disc random access memory (DVD-RAM) standard (DVD Specifications for Rewritable Disc, Part 1 PHYSICAL SPECIFICATIONS) version 1.0, each zone has one spare area, so that 24 spare areas are allocated upon initialization since a disc has 24 zones.

In the related art, as shown in FIG. 1, a flag representing the state of the spare area allocated to each zone within a defect management area (DMA) is constituted of only one bit, which represents whether or not a corresponding spare area can be used, i.e., whether it is occupied. Accordingly, a full spare area flag has 24 bits of information representing whether or not 24 spare areas are occupied. Also, this full spare area flag is stored in relative byte positions (RBP) 8 to 15 of a secondary defect list (SDL) of the DMA. When a bit representing a corresponding group is "1", this represents that no spare area remains within the corresponding group, and when the bit is "0", this represents that a spare area remains within the corresponding group.

Information on a spare area, which is constituted of only one bit as described above, represents only whether the spare area is occupied. On the other hand, in discs in which a supplementary spare area can be allocated after initialization, it is preferable that the supplementary spare area is allocated on a disc when the spare area has some room in a state of being almost occupied rather than when the spare area is completely occupied. However, a problem occurs in that the state in which the spare area is almost occupied cannot be represented by only the one bit.

Also, in the allocation of spare areas according to the existing DVD-RAM standard version 1.0, a predetermined amount of spare area is allocated to each zone upon initialization, the size of which is predetermined to be sufficient to process all defects that can be managed by a defect management method that is applied to a corresponding disc.

Here, in order to manage defects on a general recordable/rewritable disc, a slipping replacement method of skipping defects without providing logical sector numbers to the defects, is not used for defects generated upon initialization of the disc, which are called "primary defects" It is prescribed in the existing DVD-RAM standard version 1.0 that the position of a defective sector replaced by slipping replacement must be recorded in a primary defect list (PDL) in a DMA on a disc. Also, linear replacement for replacing error correction code (ECC) blocks of an erroneous zone with normal blocks in a spare area, is used for defects generated during use of the disc, which are called "secondary defects." It is prescribed in the existing DVD-RAM standard version 1.0 that the position of a defective block replaced by linear replacement must be recorded in an SDL in a DMA on a disc.

However, when an appropriate amount of spare area is allocated according to the state of a disc upon initialization, and a supplementary spare area is allocated as the state of the disc becomes bad during use of the disc ("bad" meaning that the more the disc is used, the more defects it has), a more effective spare area allocating method is required. It is prescribed in the existing standard that in a recording and/or reproducing apparatus of a disc, the size of a buffer for temporarily storing defect management information existing on a disc is 32 Kbytes. Accordingly, a restriction is generated in that the actual number of defects that can be managed becomes less than the number of defects that can be recorded in the DMA on the disc.

Here, the defect management information includes PDL and SDL, and the sum of the sizes of the PDL and SDL is about 60 Kbytes. Thus, in the DVD-RAM standard version 1.0, PDL ranges from sectors 1 to 15, and the remaining sectors are set to be used to process SDL entries, so that the number of PDL entries and SDL entries that can be processed is restricted in accordance with the size (32 Kbytes) of a buffer of a recording and/or reproducing apparatus.

SUMMARY OF THE INVENTION

To solve the above problems, an object of the present invention is to provide a recording medium having information associated with the size and the remaining amount of a spare area allocated upon initialization, and with the size and the remaining amount of a spare area allocated after initialization.

Another object of the present invention is to provide a method of simply calculating and allocating a spare area for slipping replacement and a spare area for linearly replacing some defects, while a disc is being initialized, and a spare area for linear replacement which is required during use of the disc.

Still another object of the present invention is to provide a method of managing defects in a supplementary spare area which is allocated for linear replacement while the disc is being used.

Additional objects and advantages of the invention will be set forth in part in the description which follows and, in part, will be obvious from the description, or may be learned by practice of the invention.

To achieve the first and other objects, the present invention provides a recording medium such that a primary spare area is allocated upon initialization and a supplementary spare area is allocated after initialization, and the sizes of the spare areas are determined by the number of defects generated upon initialization.

To achieve the second and other objects, the present invention provides a method of allocating a total spare area to manage defects in a disc recording and/or reproducing apparatus, the method including determining the minimum size of the total spare area using the number of primary defects generated during initialization; determining the maximum size of the total spare area that must be allocated according to the size of a memory device for defect management of the disc recording and/or reproducing apparatus; and allocating a primary spare area for slipping replacement and linear replacement using the minimum and maximum sizes of the total spare area.

To achieve the third and other objects, the present invention provides a defect management method for a disc recording and/or reproducing apparatus having a primary spare area allocated to replace primary defects generated during initialization using slipping replacement, and a supplementary spare area allocated to replace secondary defects generated after initialization using linear replacement, the method comprising allocating the supplementary spare area using an area that has already been linearly replaced, wherein defective blocks within the supplementary spare area which has already been linearly replaced are not used for linear replacement, and SDL entries within a defect management area with respect to the defective blocks are not changed.

BRIEF DESCRIPTION OF THE DRAWINGS

The above and other objects and advantages of the present invention will become more apparent by describing in detail preferred embodiments thereof with reference to the attached drawings, in which:

FIGS. 3A and 3B are views illustrating methods of managing a defect generated on a supplementary spare area in the structure of the disc shown in FIG. 2;

FIGS. 4A and 4B are tables showing allocation of a primary spare area and a supplementary spare area according to the present invention, when the size of a buffer for defect management in a disc recording and/or reproducing apparatus is 32 Kbytes and 64 Kbytes, respectively;

DESCRIPTION OF THE PREFERRED EMBODIMENTS

Spare areas on a disc for defect management according to the present invention include a primary spare area and one or more supplementary spare areas.

The primary spare area is first allocated for defect replacement when a disc is initialized, and is first used for slipping replacement. The primary spare area remaining after slipping replacement can also be used for linear replacement. The supplementary spare area, for linearly replacing defects generated while the disc is being used, denotes a spare area which is additionally allocated while a disc is being used after it has been initialized.

Figure 1:
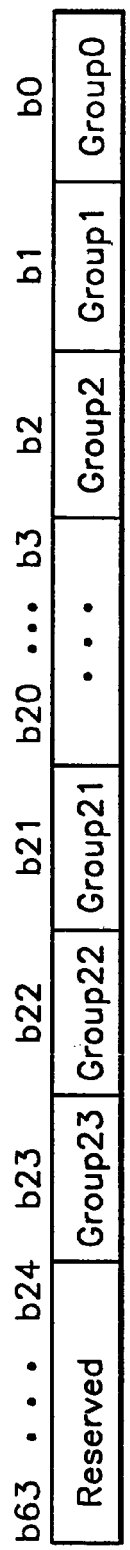
FIG. 1 is a view illustrating the structure of a conventional full spare area flag having SDL contents.
Figure 2:
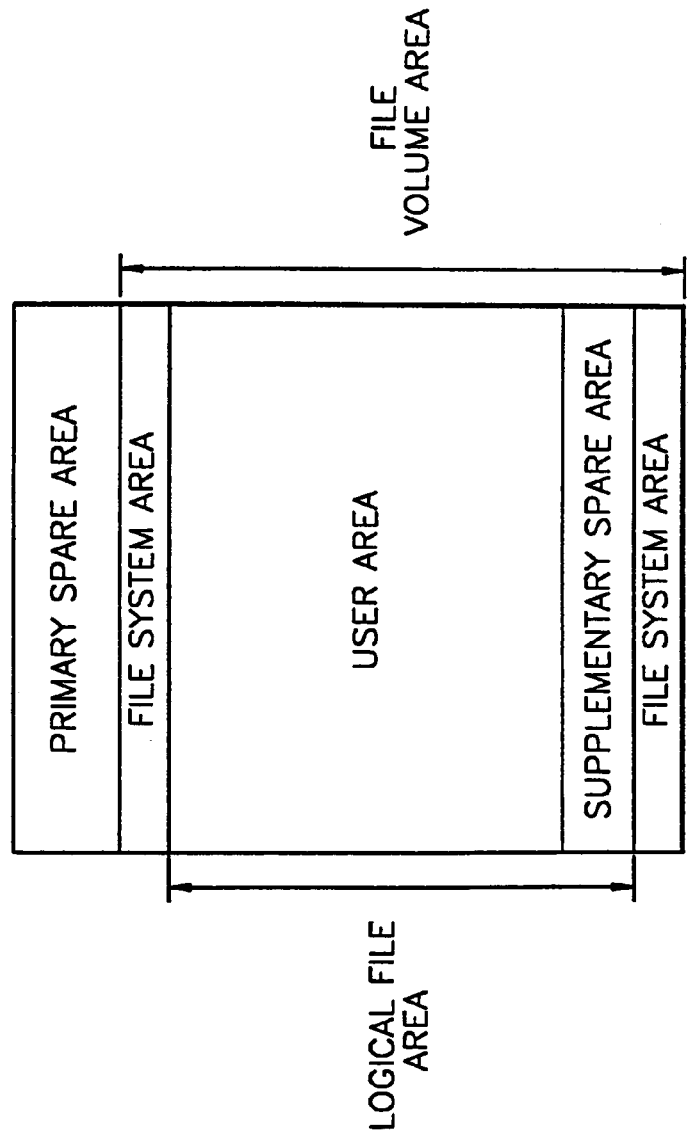
FIG. 2 is a view illustrating the structure of a disc having a user area, a primary spare area and a supplementary spare area, according to the present invention.

That is, in the present invention as shown in FIG. 2, a primary spare area for slipping replacement and linear replacement is allocated on a disc during initialization of the disc. The slipping replacement performs replacement in units of sectors, thus increasing the efficiency of utilization of the spare area. However, in the slipping replacement, defective areas are merely not used, and data starts being recorded in the next normal data sector, so that the defective areas cannot be used after initialization.

The primary spare area must have a minimum spare area necessary for slipping replacement and a predetermined amount of spare area for linearly replacing defects that can be generated on a disc while the disc is being used. Here, the portion of the primary spare area for slipping replacement requires at least as many sectors as the number of entries registered in a PDL among defect management information.

Supplementary spare areas of predetermined sizes are allocated in a forward direction from the rearmost portion of a same logical file area when the primary spare area is insufficient to process secondary defects generated during use of the disc after initialization.

In the present invention, a direct pointing rule is also applied as a defect management method for spare areas proposed by the DVD-RAM standard version 1.0. That is, all defects must be processed by only one replacement.

An extensible supplementary spare area allocated for linear replacement after initialization could have been already used as a user data area. That is, a defective block, which is used as a user data area, is allocated as a supplementary spare area, and it could be linearly replaced by a primary spare area or a supplementary spare area which has already been allocated, as shown in FIG. 3A. When a spare area which has already been linearly replaced is intended to be used as a supplementary spare area, dual replacement of a defect in another user area by a defective block already linearly replaced within the supplementary spare area violates the direct pointing rule. Also, in read-only discs, the process of replacement is complicated.

To solve these problems, as shown in FIG. 3B, a defective block within the supplementary spare area that has already been linearly replaced by a primary spare area or a pre-allocated supplementary spare area as shown in FIG. 3B, must not be used for linear replacement. Also, secondary defect list (SDL) entries for a corresponding defective block stored in a defect management area must not be changed. The reason why the SDL entries must not be changed is that a portion of the spare area, which is skipped and not used while the spare area is being sequentially used, is determined to be a defective area if the SDL entries used to process defects with a supplementary spare area are erased. Thus, a normal block used for linear replacement can be misdetermined as a defect, and thus, when formatting is performed later, a non-defective portion can be registered as a defect. Therefore, SDL entry information with respect to a linearly-replaced defective block within the supplementary spare area is not changed, and the corresponding defective block must not be used to linearly replace a defect within a user area.

In disc recording and/or reproducing apparatuses, information on a disc is initially read by a temporary storage area such as a semiconductor memory, that is, a buffer, in order to immediately use defect management information. It is prescribed in the DVD-RAM standard version 1.0 that a 32 Kbyte-size buffer is used. 32 Kbytes correspond to information for 16 sectors, and PDL and SDL for defect management information are stored in the buffer in units of sectors. Thus, the minimum number of PDL entries stored in the buffer is for one sector, and the maximum number of PDL entries stored in the buffer correspond to the maximum number of entries (i.e., 7679 entries which are for 15 sectors) that can be recorded in the PDL. The entries of the SDL occupy an area remaining after PDL entries are stored in the 32 Kbyte buffer, and thus can manage defect entries which have a size ranging from a minimum of one sector to a maximum of 15 sectors.

Hence, the maximum allowable size of a total spare area (all of the spare areas, or in other words, a primary spare area + a supplementary spare area) is determined by the size of a buffer and the number of PDL entries generated upon initialization of a disc. Here, since a defect can probably be generated even in the spare area, an extra spare area for the possible defect must be considered.

In the present invention, a 60 Kbyte buffer that can store defect information associated with defects having a size of 30 sectors can be used to completely process the maximum number of entries (7679 entries: for 15 sectors) that can be recorded in the PDL and the maximum number of entries (3837 entries: for 15 sectors) that can be recorded in the SDL.

Also, if a buffer is set to have a 64 Kbyte size, the 64 Kbyte buffer can process as many defects as can be recorded in the defect management information area according to the standard. In an embodiment of the present invention, the most preferable sizes of the spare areas that can be allocated during initialization of a disc and during use of the disc are proposed with respect to a case in which a buffer for defect management is of 32 Kbytes and a case in which a buffer for defect management is of 64 Kbytes.

If the size of a spare area that can be allocated is restricted so as to have a predetermined amount of increment, a calculation expression for calculating a required amount of spare area can be greatly simplified as described later. In consideration of this merit, a spare area for slipping replacement for managing primary defects is calculated by dividing PDL entries in units of sectors. 512 PDL entries correspond to one sector, and the amount of a spare area for processing 512 PDL entries corresponds to 32 ECC blocks. One ECC block has 16 data sectors.

FIGS. 4A and 4B are tables showing the size of spare areas when the size of the buffer is 32 Kbytes and 64 Kbytes, respectively. The first column in each of FIGS. 4A and 4B represents the number of PDL entries, and the second column therein shows the maximum number of SDL entries, that can be processed, with respect to the number of the corresponding PDL entries. The numerals in the third column denote the minimum sizes of spare areas, which are expressed in ECC blocks, required if a spare area for defect management entries for linear replacement of one sector is allocated. That is, the minimum size of the spare area that can be allocated is the sum of all spare areas required to process the PDL entries with a spare area required to process the SDL entries for one sector.

The next column shows the minimum size of spare areas required to process all defects under a corresponding defect condition. The first subcolumn in the fourth column shows the minimum size of required spare areas in blocks, the second subcolumn shows the minimum size of required spare areas in mega bytes (MB), and the third subcolumn shows the minimum size of required spare areas as a percentage (%) of the entire capacity. The next column shows the total number of defect entries that can be processed. The last column shows the maximum amount of a spare area recommended by the present invention, that is, the amount of spare area simplified in consideration of an appropriate amount of supplementary spare area to facilitate calculation of the amount of the spare area and replace defects generated in the spare area. In the last column, the first and second subcolumns show the maximum size of recommended spare areas in blocks and the percentage of the spare area to the total recording capacity of a disc, respectively, when the increment between required spare areas is set to be 32 blocks, The third and fourth subcolumns show the maximum size of recommended spare areas in blocks and the percentage of the spare area with respect to the total recording capacity of a disc, respectively, when the increment between required spare areas is set to be 48 blocks, As shown in FIG. 4A, when a 32 Kbyte buffer is used, all defects that can be recorded in all defect management areas cannot be completely processed. As the number of primary defects (PDL entries) increases, the actual number of secondary defects that can be processed decreases, and the percentage of the total spare area also decreases. This means that the state of a disc becomes worse as the number of primary defects increases, which reduces the number of secondary defects that can be managed.

To solve this problem, referring to FIG. 4B, the present invention recommends using a 64 Kbyte buffer. In this case, a maximum number of secondary defects that can be recorded in a defect management area can be completely processed regardless of the number of primary defects. Also, the amount of total spare area can be kept relatively constant from about 2.7% to 3%.

The present invention describes a disc in which a primary spare area for defect management is partially allocated upon initialization according to the usage purpose of the disc or the state of the disc, and a supplementary spare area is allocated after initialization when the size of the spare area is insufficient. Accordingly, when the supplementary spare area must be allocated, the amount of a supplementary spare area that can be allocated must be calculated in advance. That is, the supplementary spare area can be easily allocated by recording the size of a supplementary spare area that can be allocated in a disc definition structure (DDS) of the defect management area (DMA), upon initialization.

The size of a total spare area for defect management can be simply calculated as described below. When the 64 Kbyte buffer is used, the maximum size of a total spare area that can be allocated can be calculated by the following Equation 1:

$$\text{maximum size of total spare area} = \left[\frac{E_{PDL}}{512}\right] \cdot 32 + 4096 \text{ blocks}$$

$$\text{maximum size of total spare area} = 4096 \cdot \left[\frac{E_{PDL}}{512}\right] \cdot (256 \cdot 32) \text{ blocks}$$

When the 32 Kbyte buffer is used, the maximum size of a total spare area that can be allocated can be calculated by the following Equation 2:
In Equations 1 and 2, $$\left[\frac{E_{PDL}}{512}\right]$$

denotes a maximum integer which does not exceed $$"\frac{E_{PDL}}{512}",$$

$E_{PDL}$ denotes the number of PDL entries, and 32(=INC) indicates an increment. 4096 (=$S_{MAX}$) is a multiple of 2 in which the size of a total spare area required to process the maximum number of defects is approximated for simple calculation, when the number of primary defects (the number of PDL entries) is less than 512. Here, the size of a spare area is shown in ECC blocks. 256 (=$S_{SDL}$) denotes the size of a spare area required to process SDL entries for one sector.

A maximum total spare area recommended by FIGS. 4A and 4B is about 4% larger than that an actually-required total spare area. The size of the recommended total spare area is determined in consideration of defects generated in the total spare area, and are expressed in multiples of 2, so that calculation of the size of the total spare area is simplified.

The remainder obtained by subtracting the size of a primary spare area allocated upon initialization from the maximum size of a recommended total spare area, is recorded in a DDS as the size of a supplementary spare area that can be allocated, whereby the supplementary spare area can be easily allocated during use of a disc.

A supplementary spare area is allocated or the size of the supplementary spare area must be increased, in case that a primary spare area allocated upon initialization is completely used and no other spare areas exist or the case when a supplementary spare area is completely used. When a disc is actually used, defects are highly likely to be continuously generated. Therefore, it is more preferable that a supplementary spare area is allocated or the size of a supplementary spare area is increased when a small amount of spare area remains, for example, when a certain number of blocks remain or 90% of the spare area is used, than that a supplementary spare area is allocated after the allocated spare area is completely used.

Figure 5A:
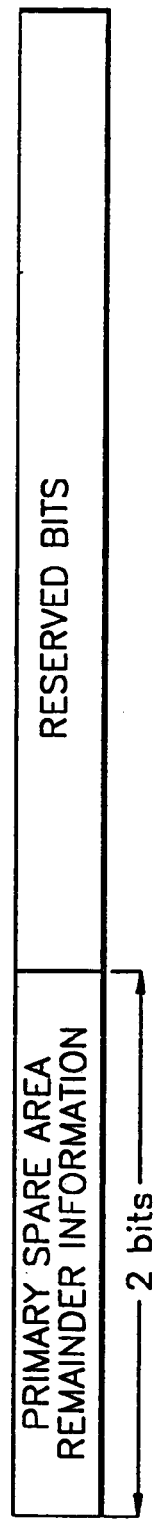
FIGS. 5A and 5B are views illustrating the structures of a flag of remainder state information which represents the degree to which a spare area for managing defects has been used, according to the present invention.

In this case, a remainder state flag representing the degree of use of a spare area is required to indicate that a predetermined amount or more of the spare area has been used, rather than representing only two states, in which the spare area has been completely used or the spare area still remains, as in an existing spare area full flag. A flag indicating whether a supplementary spare area has been allocated when a predetermined amount or more of the primary spare area has been used, is also required. In this case, a flag (which can be referred to as remainder state information for a primary spare area) representing the state of the primary spare area has such states as shown in the following Table 1, and has a structure shown in FIG. 5A.

TABLE 1

| flag value | State |
|---|---|
| 00b | A sufficient amount of primary spare area remains |
| 01b | a predetermined amount or more of primary spare area has been used, and no supplementary spare area is allocated |
| 10b | a predetermined amount or more of primary spare area has been used, and a supplementary spare area has been allocated |
| 11b | the primary spare area has been completely used |

Figure 5B:
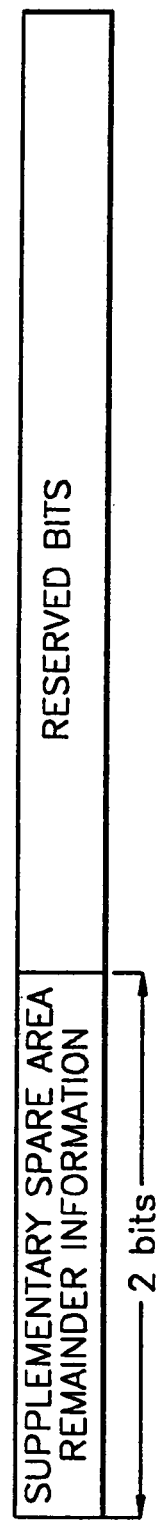

A flag (which can be referred to as remainder state information for a supplementary spare area) representing the state of the supplementary spare area has states as shown in the following Table 2, and has a structure shown in FIG. 5B.

TABLE 2

| flag value | State |
|---|---|
| 00b | a sufficient amount of supplementary spare area remains. |
| 01b | a predetermined amount or more of supplementary spare area has been used. |
| 10b | no corresponding state |
| 11b | the supplementary spare area has been completely used |

Here, the flag of Table 2 can indicate the necessity that the size of the supplementary spare area must be increased by simply representing the state in which a predetermined amount or more of supplementary spare area has been used. The supplementary spare area is enlarged by allocating at least a predetermined additional amount of a supplementary spare area, and the area adjacent to the current supplementary spare area or another area is used to perform this function. When the supplementary spare area is enlarged by allocating a predetermined amount or more of supplementary spare area, the value "01b" of the flag can simply be changed to "00b." Therefore, in contrast with the remainder state flag for a primary spare area, the remainder state flag for a supplementary spare area has only three states.

Figure 6:
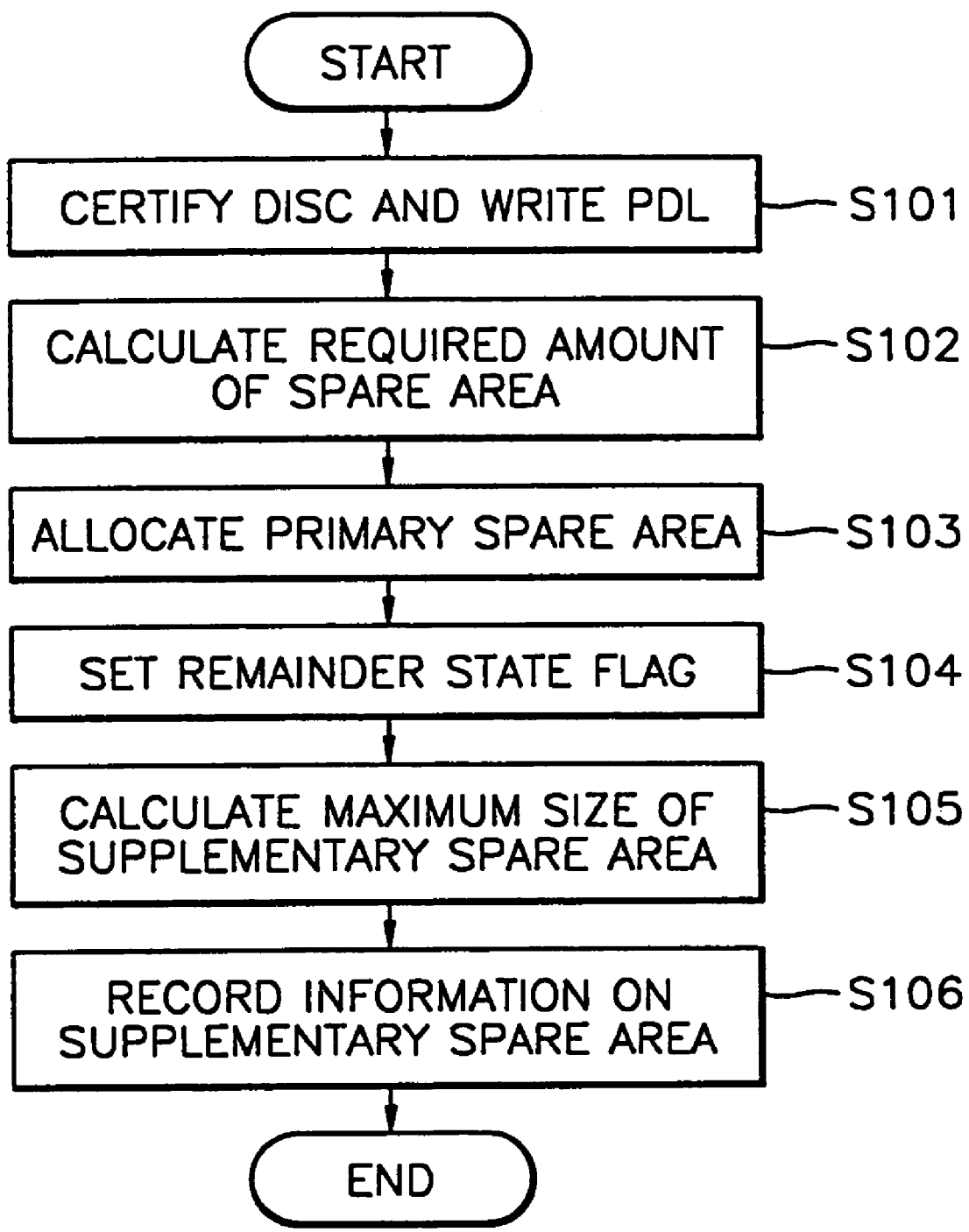
FIG. 6 is a flowchart illustrating a method of allocating primary and supplementary spare areas upon initialization, according to the present invention.

FIG. 6 is a flowchart illustrating a method of allocating a total spare area upon initialization, according to an embodiment of the present invention. Referring to FIG. 6, a defective sector detected during certification for checking the existence or absence of defects on a disc while the disc is being initialized, is skipped without being supplied with a logical sector number, and the logical sector number which was to be assigned to the defective sector is provided to the next sector, and the position of the defective sector is stored in a PDL, in step S101.

Next, the required amount of the total spare area is calculated in step S102. For example, when the number of PDL entries is between 3072 and 3583, the minimum size of a total spare area is the sum of all spare areas required to process the PDL entries and a spare area required to process SDL entries for one sector, and thus becomes 480 ECC blocks. If a 32 Kbyte buffer is used, and the increment between necessary spare areas is 32 blocks, 2752 ECC blocks obtained by calculation using Equation 2 can be allocated as the maximum size of spare area.

When the required amount of total spare area is calculated, a primary spare area is allocated, in step S103. If the size of the primary spare area is 512 ECC blocks, a maximum of 224 ECC blocks are used to process the PDL entries, and the remaining blocks are used to process the SDL entries. After the primary spare area is allocated, a remainder state flag for the primary spare area is set to an initial state "00," in step S104. The maximum size of a supplementary spare area is calculated by subtracting the size of the primary spare area, allocated in step S103, from the maximum size of the total spare area calculated in step S102, in step S105. For example, the maximum size of the supplementary spare area, 2240 ECC blocks, can be calculated by subtracting 512 ECC blocks of the allocated primary spare area from 2752 ECC blocks of the maximum spare area. Information on the size of the supplementary spare area (e.g., 2240 ECC blocks) and information on the remainder state of the supplementary spare area, are recorded at predetermined positions in a DDS or DMA area, and initialization is concluded, in step S106.

Figure 7:
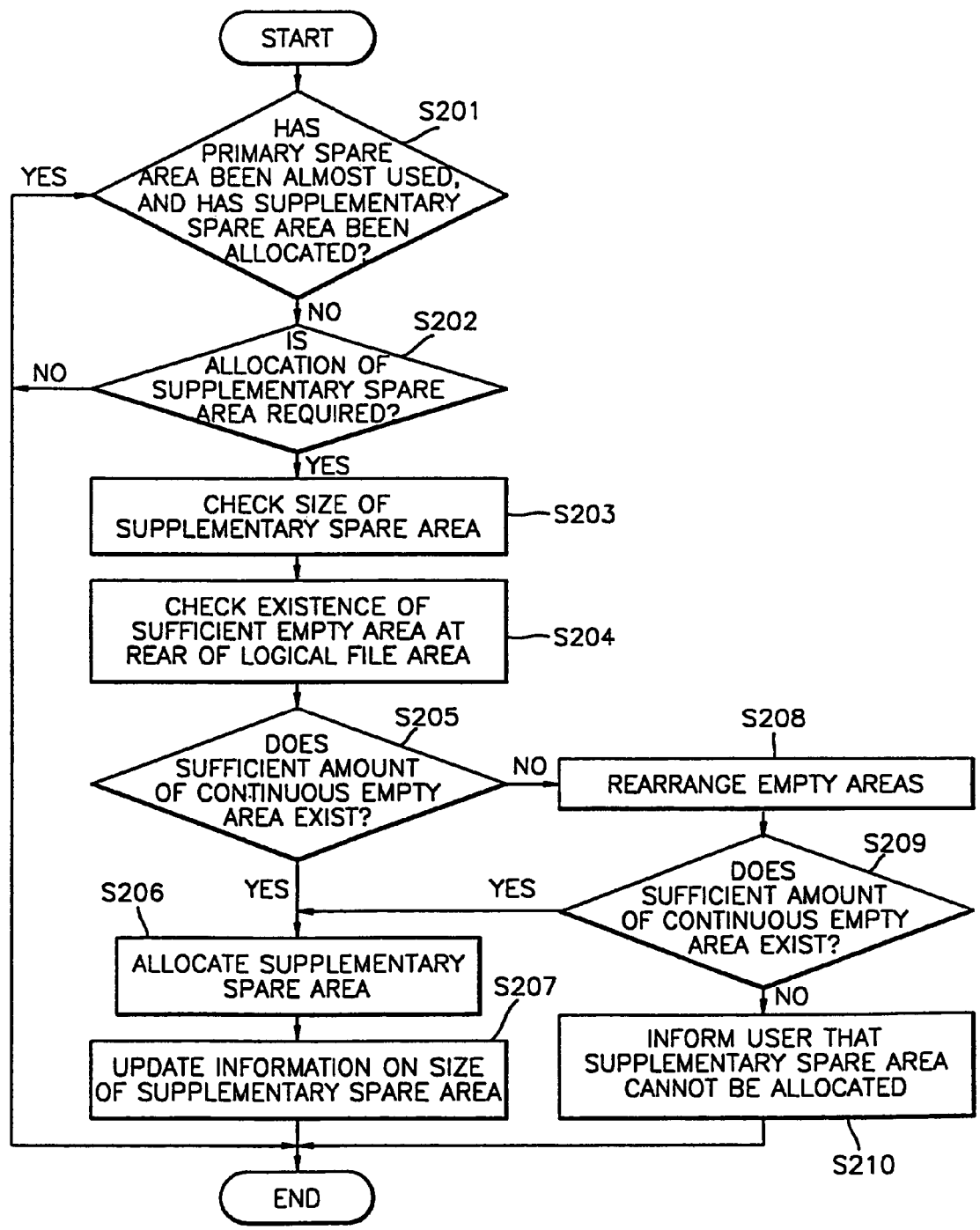
FIG. 7 is a flowchart illustrating a method of allocating a (an initial) supplementary spare area using remainder state information of a primary spare area, according to the present invention.

FIG. 7 is a flowchart illustrating a method of allocating a supplementary spare area using information on the remainder state of a primary spare area, according to an embodiment of the present invention. A determination is made as to whether a remainder state flag for the primary spare area set during initialization is in a state "01" in which the primary spare area has been almost used and a supplementary spare area has been allocated, in step S201. If the answer to the step S201 is NO, another determination is made as to whether a supplementary spare area is to be allocated, in step S202. If it is determined in step S202 that allocation of a supplementary spare area is required, the size of the supplementary spare area is checked, in step S203. That is, the maximum size of a supplementary spare area that can be allocated, and the maximum size of a supplementary spare area that must be allocated, are checked. The size of the supplementary spare area that must be allocated, can be set by a user, or can be a preset predetermined increment.

The existence of a sufficient amount of continuous empty space at the rear of a logical file area is checked, in step S204. It is determined whether enough empty space exists, in step S205. If enough empty space exists at the rear of the logical file area, a supplementary spare area for linear replacement, of a predetermined size, is allocated starting from the rearmost portion of the logical file area, in step S206. Management information for the supplementary spare area, that is, a remainder state flag for the supplementary spare area, is initialized back to "00", and the information on the size of the supplementary spare area is updated, in step S207. Then, the process is concluded. When an area that has already been linearly replaced is allocated as the supplementary spare area for linear replacement in step S206, a defective block within the supplementary spare area is not used for linear replacement, and the SDL entries must be kept without change, as described above referring to FIG. 3.

If a sufficient amount of continuous empty area does not exist at the rear portion of the logical file area in step S205, empty areas are rearranged in step S208. Preferably, this is done by physically moving the empty areas. Then, a determination is made as to whether a sufficient amount of continuous empty area exists, in step S209. If there is a sufficient amount of continuous empty area, the step S206 for allocating a supplementary spare area is again performed. If the amount of continuous empty area is insufficient even after the rearrangement of the empty areas, a message "a supplementary spare area cannot be allocated" is displayed, in step S210. Then, the process is concluded.

Figure 8:
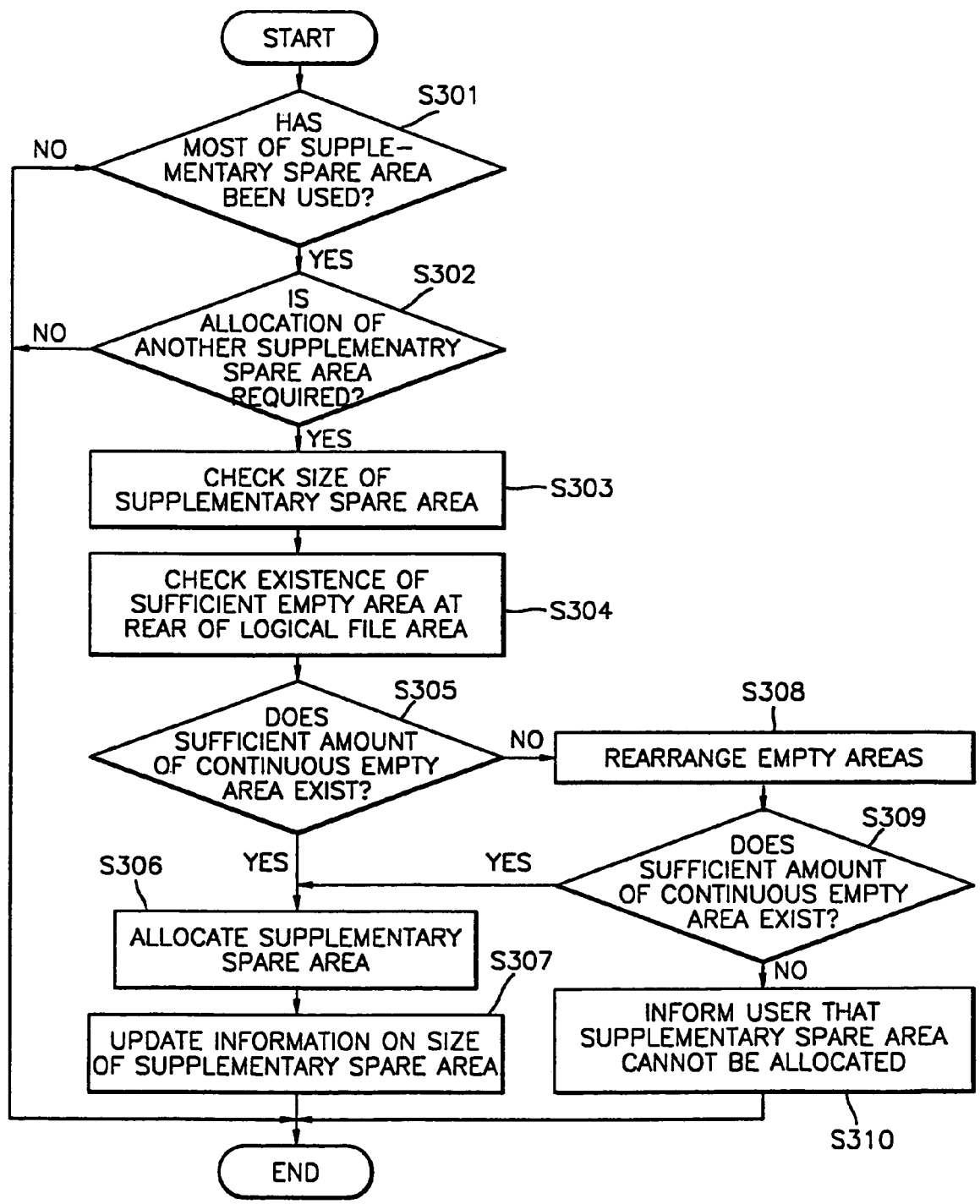
FIG. 8 is a flowchart illustrating a method of allocating an another supplementary spare area using remainder state information of an initial supplementary spare area, according to the present invention.

FIG. 8 is a flowchart illustrating a method of allocating another supplementary spare area using information on the remainder state of an initial supplementary spare area, according to an embodiment of the present invention. A determination is made as to whether a remainder state flag for the initial supplementary spare area for replacing secondary defects generated during use of a disc is in a state "01" in which the initial supplementary spare area has been almost used, in step S301. If most of the initial supplementary spare area has been used, another determination is made as to whether another supplementary spare area is to be allocated, in step S302. If it is determined in step S302 that allocation of another supplementary spare area is required, the size of the another supplementary spare area is checked, in step S303. That is, the maximum size of a supplementary spare area that can be allocated, and the size of the another supplementary spare area that must be allocated, are checked. The maximum size of a supplementary spare area is determined by subtracting the size of a spare area allocated upon initialization from the maximum size of the total spare area. The size of the supplementary spare area that must be allocated can be set by a user or can be a preset predetermined increment.

The existence of a sufficient amount of continuous empty space at the rear of a logical file area is checked, in step S304. Then, it is determined whether the empty space exists, in step S305. If enough empty space exists at the rear of the logical file area, another supplementary spare area for linear replacement, of a predetermined size, is allocated starting from the rearmost portion of the logical file area, in step S306. When an area that has already been linearly replaced is allocated as the supplementary spare area for linear replacement in step S306, a defective block within the supplementary spare area is not used for linear replacement, and the SDL entries must be kept without change, as described above referring to FIG. 3.

After the step S306, management information for the another supplementary spare area, that is, a remainder state flag for the another supplementary spare area, is initialized back to "00", and the size of the allocated another supplementary spare area is updated, in step S307. Then, the process is concluded.

If a sufficient amount of continuous empty area does not exist at the rear portion of the logical file area in step S305, empty areas are rearranged in step S308. Then, a determination is made as to whether a sufficient amount of continuous empty area exists, in step S309. If there is a sufficient amount of continuous empty area, the step S306 for allocating the another supplementary spare area is again performed. If the amount of continuous empty area is insufficient even after the rearrangement of the empty areas, a message "a supplementary spare area cannot be allocated" is displayed, in step S310. Then, the process is concluded.

As described above, in the present invention, information on the sizes of a primary spare area and a supplementary spare area can be calculated by a simple numerical expression, and information on the remainder states of spare areas is stored and managed, so that the spare areas can be more flexibly and effectively allocated and managed.

Also, in the present invention, defective blocks within the supplementary spare area are not used for linear replacement, and SDL entries are not changed, so that malfunction is prevented.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A defect management method, comprising:
performing defect management of a recording medium by selectively using a plurality of blocks in a spare area as blocks to replace defective blocks based on a predetermined designation that a particular one of the plurality of blocks of the spare area will not be used to replace a defective block, another block has been assigned to replace the particular one block as a spare block and is in one of the first and second spare areas; and
continuing the performing of the defect management even when it is determined that the particular one block is not to be used to replace the defective block, wherein the spare area is a supplementary spare area allocated and/or expanded after initialization of the recording medium.

2. The defect management method of claim 1, further comprising:
storing remainder state information including an indicator that distinguishes between and identifies whether the supplementary spare area is not used, at least used a predetermined amount, and full; and
further performing defect replacement based on the remainder state information.

3. The defect management method of claim 1, wherein a size of the supplementary spare area is based on a number of defects generated upon initialization of said recording medium.

4. The defect management method of claim 1, further comprising storing remainder state information that indicates whether the supplementary spare area has been allocated on the recording medium as distinguished from when the supplementary spare area has not been allocated.

5. The defect management method of claim 1, further comprising storing, on the recording medium, information of a size and remainder state of the supplementary spare area, with the information of the size and remainder state of the supplementary spare area being stored upon initialization of the recording medium.

6. The defect management method of claim 1, further comprising storing, on the recording medium, remainder state information for the supplementary spare area selectively indicating whether a sufficient amount of the supplementary spare area remains unused, at least a predetermined amount of the supplementary spare area has been used, and the supplementary spare area has been completely used.

7. A defect management method, comprising:
performing defect management of a recording medium by selectively using a plurality of blocks in a spare area to replace defective blocks based on a predetermined designation that a particular one of the plurality of blocks will not be used to replace a defective block;
continuing the performing of the defect management even when it is determined that the particular one block is not to be used;
allocating a primary spare area upon initialization of the recording medium;
allocating and/or expanding a supplementary spare area after the initialization; and
storing, on the recording medium, remainder state information for the primary and supplementary spare areas representing degrees of use of the primary and supplementary spare areas, respectively.

8. The defect management method of claim 7, further comprising storing the remainder state information either in a defect management area or a disc definition structure area of the recording medium.

9. The defect management method of claim 7, wherein the remainder state information for the primary spare area selectively indicates whether a sufficient amount of the primary spare area remains to manage defects, whether at least a predetermined amount of the primary spare area has been used and no supplementary spare area has been allocated, whether at least the predetermined amount of the primary spare area has been used and the supplementary spare area has been allocated, and whether the primary spare area has been completely used.

10. The defect management method of claim 7, further comprising:
storing in the remainder state information an indicator that distinguishes between and identifies whether the supplementary spare area is not used, at least used a predetermined amount, and full; and
further performing defect replacement based on the remainder state information.

11. The defect management method of claim 7, wherein a size of the supplementary spare area is based on a number of defects generated upon initialization of said recording medium.

12. The defect management method of claim 7, wherein the remainder state information for the spare area further indicates whether the supplementary spare area has been allocated on the recording medium as distinguished from when the supplementary spare area has not been allocated.

13. The defect management method of claim 7, further comprising storing, on the recording medium, information of a size and remainder state of the supplementary spare area, with the information of the size and remainder state of the supplementary spare area being stored upon initialization of the recording medium.

* * * * *